United States Patent
Jiang

(10) Patent No.: US 9,270,261 B2
(45) Date of Patent: Feb. 23, 2016

(54) SIGNAL ADJUSTMENT CIRCUIT

(71) Applicant: FUJITSU LIMITED, Kawasaki-shi, Kanagawa (JP)

(72) Inventor: Jian Hong Jiang, Los Altos, CA (US)

(73) Assignee: FUJITSU LIMITED, Kawasaki (JP)

( * ) Notice: Subject to any disclaimer, the term of this patent is extended or adjusted under 35 U.S.C. 154(b) by 33 days.

(21) Appl. No.: 14/326,323

(22) Filed: Jul. 8, 2014

(65) Prior Publication Data

US 2016/0013784 A1    Jan. 14, 2016

(51) Int. Cl.
*H03L 7/06* (2006.01)
*H03K 5/14* (2014.01)
*H03L 7/08* (2006.01)

(52) U.S. Cl.
CPC ... *H03K 5/14* (2013.01); *H03L 7/08* (2013.01)

(58) Field of Classification Search
CPC .............. H03K 5/14; H03L 7/06; H03L 7/08; H03L 7/0805
USPC .................................. 327/147–150, 156–159
See application file for complete search history.

(56) References Cited

U.S. PATENT DOCUMENTS

2011/0298508 A1 * 12/2011 Wu et al. ..................... 327/157

OTHER PUBLICATIONS

K.Kanda, et al., "A Single-40 Gb/s Dual-20 Gb/s Serializer IC With SFI-5.2 Interface in 65 nm CMOS" IEEE Journal of Solid-State Circuits, vol. 44 No. 12,Dec. 2009, pp. 3580-3589.

* cited by examiner

*Primary Examiner* — William Hernandez
(74) *Attorney, Agent, or Firm* — Maschoff Brennan

(57) ABSTRACT

A circuit may include a phase detector circuit, a charge pump circuit, a delay circuit, and a multiplexer circuit. The phase detector circuit may be configured to output a comparison signal based on a comparison of a phase of an inversion of a first clock signal and a phase of a multiplexer signal. The charge pump may be configured to integrate the comparison signal and to output a control voltage based on the integration of the comparison signal. The delay circuit may be configured to receive a second clock signal, to delay the second clock signal based on the control voltage, and to output the delayed second clock signal. The second clock signal may be a divided version of the first clock signal. The multiplexer circuit may be configured to output the multiplexer signal based on the delayed second clock signal.

20 Claims, 7 Drawing Sheets

SIGNAL ADJUSTMENT CIRCUIT

FIELD

The embodiments discussed herein are related to signal adjustment circuits.

BACKGROUND

Data serializers may be commonly found in various electronic devices. The function of a data serializer is to convert parallel data into a corresponding stream of serial data. Data serializers are sometimes used in integrated circuit devices where data may be coupled to or from an electronic device at a significantly faster rate than the data may be processed within the device. For example, in integrated memory devices, data may be coupled to or from a memory device at a rate that may be significantly faster than the rate at which the data may be serially processed in the memory device. In these cases, for example, read data may be provided by an array of memory cells in the memory device as a large number of parallel digits (e.g., bits), which are converted to a corresponding stream of serial data and output through a serial data port.

Although the design parameters of serializers may vary for different applications, two design parameters that may be considered for serializers are power consumption and operating speed. Operating speed may be important to allow read data to be transmitted from a memory device with a high data bandwidth. Low power consumption may be important in various applications, such as where a serializer is used in a battery-powered electronic system, such as a laptop computer, tablet, or other mobile device.

The subject matter claimed herein is not limited to embodiments that solve any disadvantages or that operate only in environments such as those described above. Rather, this background is only provided to illustrate one example technology area where some embodiments described herein may be practiced.

SUMMARY

According to an aspect of an embodiment, a circuit may include a phase detector circuit, a charge pump circuit, a delay circuit, and a multiplexer circuit. The phase detector circuit may be configured to output a comparison signal based on a comparison of a phase of an inversion of a first clock signal and a phase of a multiplexer signal. The charge pump circuit may be coupled to the phase detector. The charge pump may be configured to integrate the comparison signal and to output a control voltage based on the integration of the comparison signal. The delay circuit may be coupled to the charge pump circuit. The delay circuit may be configured to receive a second clock signal, to delay the second clock signal based on the control voltage, and to output the delayed second clock signal. The second clock signal may be a divided version of the first clock signal. The multiplexer circuit may be coupled to the delay circuit and the phase detector circuit. The multiplexer circuit may be configured to output the multiplexer signal based on the delayed second clock signal.

The object and advantages of the embodiments will be realized and achieved at least by the elements, features, and combinations particularly pointed out in the claims.

It is to be understood that both the foregoing general description and the following detailed description are exemplary and explanatory and are not restrictive of the invention, as claimed.

BRIEF DESCRIPTION OF THE DRAWINGS

Example embodiments will be described and explained with additional specificity and detail through the use of the accompanying drawings in which.

DESCRIPTION OF EMBODIMENTS

According to an aspect of an embodiment, a circuit is disclosed for serializing data from multiple data streams into a serial data stream using multiple multiplexer circuits. The circuit includes an adjust circuit that adjusts a phase of a first clock signal provided to one of the multiplexer circuits in relation to a phase of a second clock signal provided to another of the multiplexer circuits. By adjusting the phase of the first clock signal, a data signal may be sampled more reliably by another of the multiplexer circuits.

Embodiments of the present disclosure will be explained with reference to the accompanying drawings.

Figure 1:
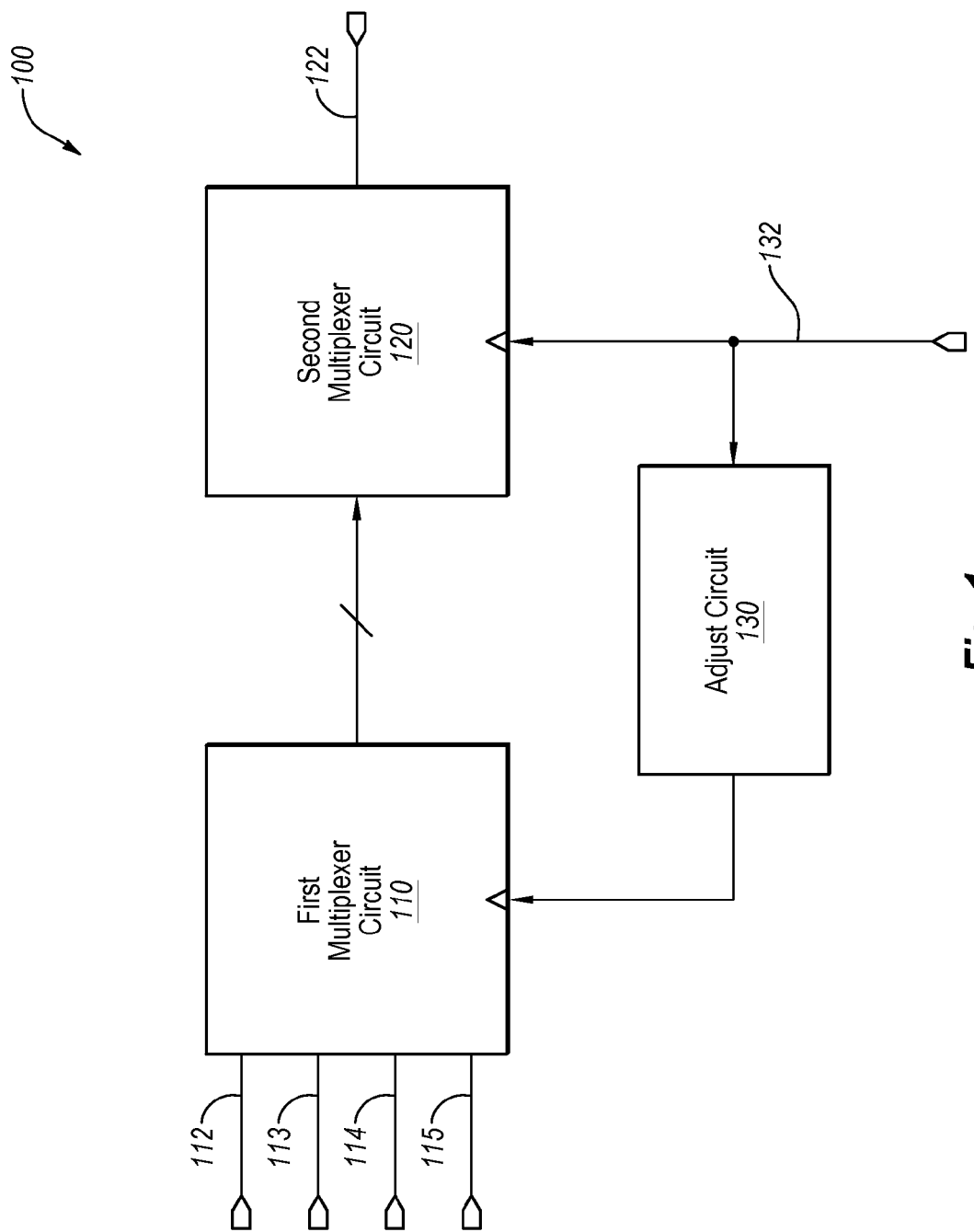
FIG. 1 is a diagram of an example circuit for serializing data.

FIG. 1 is a diagram of an example circuit 100 for serializing data, arranged in accordance with at least one embodiment described herein. The circuit 100 may include a first multiplexer circuit 110, a second multiplexer circuit 120, and an adjust circuit 130. The first multiplexer circuit 110 may be coupled to the second multiplexer circuit 120 and the adjust circuit 130 may be coupled to the first multiplexer circuit 110.

The first multiplexer circuit 110 may include first, second, third, and fourth input terminals 112-115, referred to herein as the input terminals 112-115. Each of the input terminals 112-115 may be configured to receive an input data signal. In particular, the first input terminal 112 may receive a first data signal. The second input terminal 113 may receive a second data signal. The third input terminal 114 may receive a third data signal. The fourth input terminal 115 may receive a fourth data signal. The data signals may be parallel data signals in that they provide data at approximately the same data rate in a parallel manner. The first multiplexer circuit 110 may be configured to generate a first combined data signal based on the first and second data signals. In particular, the first multiplexer circuit 110 may be configured to multiplex the first and second data signals into the first combined data signal based on logical high and low of a second clock signal received from the adjust circuit 130. For example, the first combined data signal may be formed by interweaving alternate data symbols from the first and second data signals. In some embodiments, the first combined data signal may have a data rate that is twice the data rate of the first and second data signals.

The first multiplexer circuit 110 may be further configured to generate a second combined data signal based on the third and fourth data signals. The first multiplexer circuit 110 may generate the second combined data signal in a similar manner as described with respect to the generation of the first combined data signal. The first and second combined data signals may be parallel data signals in that they provide data at approximately the same data rate in a parallel manner. The data rate of the first and second combined data signals may be approximately equal or equal to the clock rate of the second clock signal. The first multiplexer circuit 110 may output the first and second combined data signals to the second multiplexer circuit 120 based on the second clock signal.

In some embodiments, the first multiplexer circuit 110 may include one or more latches for each of the data signals and a four-to-two multiplexer or two two-to-one multiplexers. In other embodiments, the first multiplexer circuit 110 may include other or additional active or passive circuit elements.

The second multiplexer circuit 120 may be configured to receive the first and second combined data signals. The second multiplexer circuit 120 may be configured to generate a third combined data signal based on the first and second combined data signals. In particular, the second multiplexer circuit 120 may be configured to multiplex the first and second combined data signals into the third combined data signal based on logical high and low of a first clock signal received on a fifth input terminal 132. For example, the third combined data signal may be formed by interweaving alternate data symbols from the first and second combined data signals. In some embodiments, the third combined data signal may have a data rate that is twice the data rate of the first and second combined data signals. The second multiplexer circuit 120 may output the third combined data signal on an output terminal 122.

The adjust circuit 130 may be configured to generate the second clock signal based on the first clock signal received on the fifth input terminal 132. The second clock signal may have a clock rate that is approximately half of the clock rate of the first clock signal. Furthermore, the adjust circuit 130 may be configured to adjust a phase of the second clock signal in relation to the phase of the first clock signal. In particular, the adjust circuit 130 may be configured to adjust the phase of the second clock signal such that the first multiplexer circuit 110 adjusts the timing of an approximate middle of the data symbols of the first and second combined data signals to align with an edge of the first clock signal.

Furthermore, the adjust circuit 130 may be configured to adjust the phase of the second clock signal to maintain the alignment of the approximate middle of the data symbols of the first and second combined data signals with an edge of the first clock signal during operation of the circuit 100.

For example, due to variations in temperature, supply voltage, electromagnetic interference, manufacturing process variations, or other factors, the approximate middle of the data symbols of the first and second combined data signals may be skewed away from an edge of the first clock signal. For example, the first multiplexer circuit 110 may slightly alter when it outputs the first and second combined signals with respect to the second clock signal due to one or more factors as discussed above. As a result, even when the first and second clock signals are aligned properly to operate under a first set of conditions, the approximate middle of the data symbols of the first and second combined data signals may not be aligned with an edge of the first clock signal under a second set of conditions.

The adjust circuit 130 may be configured to detect when the approximate middle of the data symbols of the first and second combined data signals are not aligned with an edge of the first clock signal. In response to the approximate middle of the data symbols of the first and second combined data signals not being aligned with an edge of the first clock signal, the adjust circuit 130 may be configured to adjust the second clock signal. Adjusting the second clock signal may cause the first multiplexer circuit 110 to adjust the phase of the approximate middle of the data symbols of the first and second combined data signals. In particular, the adjust circuit 130 may adjust the second clock signal to cause the first multiplexer circuit 110 to align the approximate middle of the data symbols of the first and second combined data signals with an edge of the first clock signal. In these and other embodiments, the adjust circuit 130 may adjust the second clock signal to align the approximate middle of the data symbols of the first and second combined data signals with a rising or falling edge of the first clock signal.

In some embodiments, aligning the approximate middle of the data symbols of the first and second combined data signals with a rising or falling edge of the first clock signal may facilitate the ability of the second multiplexer circuit 120 to generate the third combined data signal. For example, the second multiplexer circuit 120 may include one or more latches, e.g., flip-flops, or other circuit element that may capture the data from the first and second combined data signals on a rising or falling edge of the first clock signal. At signal speeds higher than 100 megahertz, when the approximate middle of the data symbols of the first and second combined data signals are not properly aligned with an edge of the first clock signal, the second multiplexer circuit 120 may not be able to capture the data from the first and second combined data signals. As a result, data may be lost when the data is serialized. The adjust circuit 130 may be configured to adjust the second clock signal such that the approximate middle of the data symbols of the first and second combined data signals aligns with an edge of the first clock signal. Aligning the approximate middle of the data symbols of the first and second combined data signals with an edge of the first clock signal may reduce data loss when the first and second combined data signals are serialized by the second multiplexer circuit 120.

Modifications, additions, or omissions may be made to the circuit 100 without departing from the scope of the present disclosure. For example, in some embodiments, the circuit 100 may include additional passive or active circuit components. As another example, the first and second clock signals may be single-ended clock signals or differential clock signals. Alternately or additionally, the data signals discussed with respect to FIG. 1 may be single-ended data signals or differential data signals. Alternately or additionally, the first, second, third, and fourth data signals may be combined data signals received from other multiplexing circuits.

Figure 2:
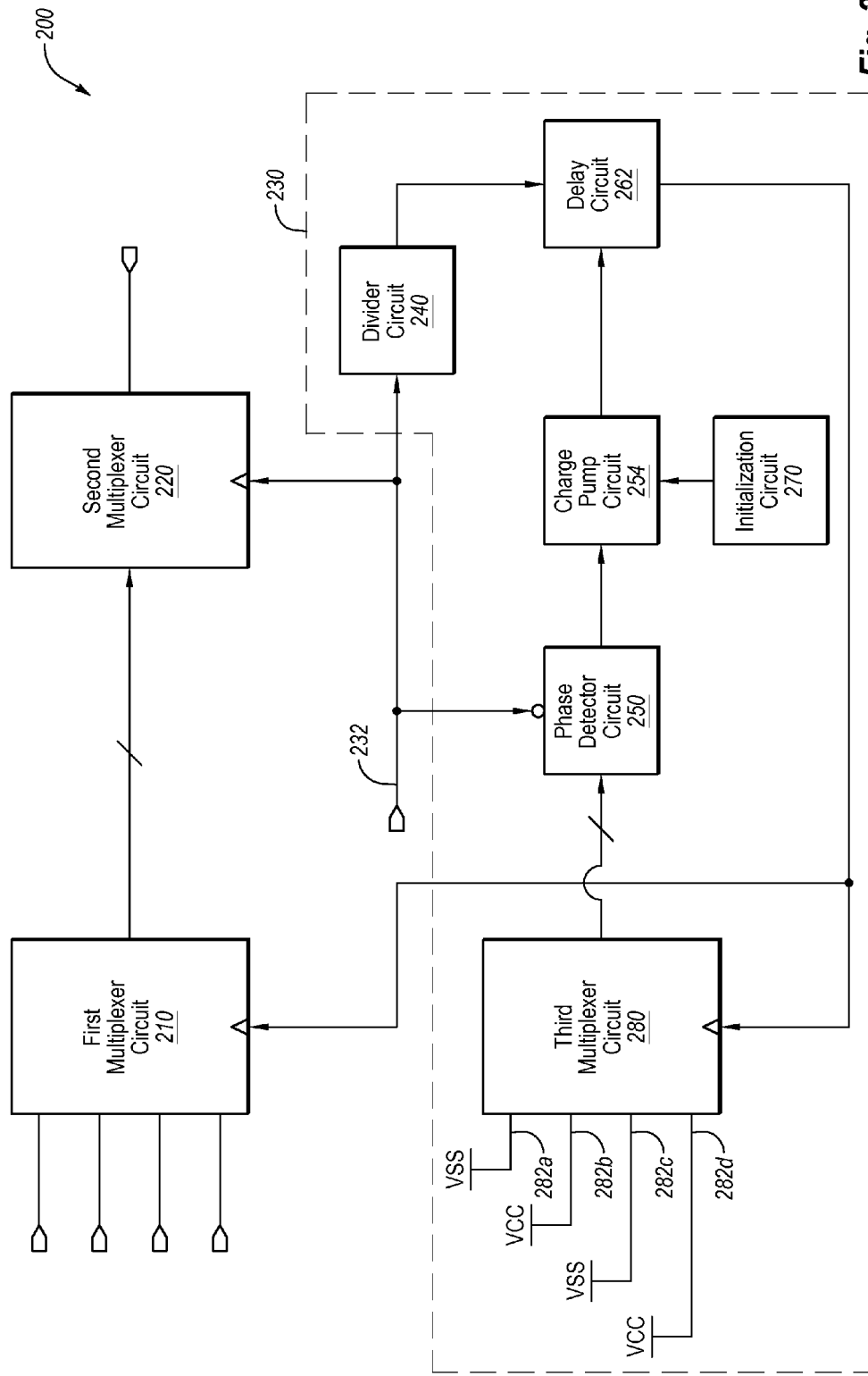
FIG. 2 is a diagram of another example circuit for serializing data.

FIG. 2 is a diagram of another example circuit 200 for serializing data, arranged in accordance with at least one embodiment described herein. The circuit 200 may include a first multiplexer circuit 210, a second multiplexer circuit 220, and an adjust circuit 230.

The first multiplexer circuit 210 may be configured to receive first, second, third, and fourth data signals that are parallel to one another. The first multiplexer circuit 210 may be configured to generate a first combined data signal based on the first and second data signals. The first multiplexer circuit 210 may be further configured to generate a second combined data signal based on the third and fourth data signals. The first and second combined data signals may be parallel data signals. The data rate of the first and second combined data signals may be approximately equal or equal to a clock rate of a second clock signal. The first multiplexer circuit 210 may output the first and second combined data signals to the second multiplexer circuit 220 based on the second clock signal.

The second multiplexer circuit 220 may be configured to receive the first and second combined data signals. The second multiplexer circuit 220 may be configured to generate a third combined data signal based on the first and second combined data signals using a first clock signal received on a clock signal terminal 232. In these and other embodiments, the second multiplexer circuit 220 may sample the first and second combined data signals using the first clock signal. Based on the samples of the first and second combined data signals, the second multiplexer circuit 220 may generate the third combined data signal. In some embodiments, the third combined data signal may have a data rate that is twice the data rate of the first and second combined data signals.

In general, the adjust circuit 230 may be configured to generate the second clock signal based on the first clock signal. The second clock signal may have a clock rate that is approximately half the clock rate of the first clock signal. Furthermore, the adjust circuit 230 may be configured to adjust a phase of the second clock signal in relation to the phase of the first clock signal. In particular, the adjust circuit 230 may be configured to adjust the phase of the second clock signal until the first multiplexer circuit 210 adjusts the phase of the first and second combined data signals so that an approximate middle of the data symbols of the first and second combined data signals aligns with an edge of the first clock signal.

FIG. 2 illustrates an example implementation of the adjust circuit 230. The adjust circuit 230 may include a divider circuit 240, a phase detector circuit 250, a charge pump circuit 254, a delay circuit 262, an initialization circuit 270, and a third multiplexer circuit 280.

The divider circuit 240 may be coupled to the clock signal terminal 232 and configured to receive the first clock signal. The divider circuit 240 may divide the first clock signal to generate a divided first clock signal. The divider circuit 240 may divide the first clock signal such that the divided first clock signal includes a clock rate that is less than the clock rate of the first clock signal. In these and other embodiments, the divisor of the divider circuit 240 may be greater than one. In some embodiments, the divisor of the divider circuit 240 may be two. As a result, the divided first clock signal may have a clock rate that is half the clock rate of the first clock signal. The divider circuit 240 may provide the divided first clock signal to the delay circuit 262.

The phase detector circuit 250 may be coupled to the third multiplexer circuit 280, the clock signal terminal 232, and the charge pump circuit 254. The phase detector circuit 250 may be configured to compare the phase of an inverse of the first clock signal, referred to herein as the inverted first clock signal, with an output signal from the third multiplexer circuit 280. In particular, the phase detector circuit 250 may compare the rising edge of the inverted first clock signal with an edge of the output signal. The phase detector circuit 250 may output a comparison signal based on the comparison of the phase of the inverted first clock signal with the phase of the output signal. For example, in some embodiments, the comparison signal may be a logical high when the detected phases of the inverted first clock signal and the output signal do not match and may be a logical low when the detected phases do match. The phase detector circuit 250 may provide the comparison signal to the charge pump circuit 254.

The charge pump circuit 254 may be coupled to the phase detector circuit 250, the initialization circuit 270, and the delay circuit 262. The charge pump circuit 254 may be configured to receive the comparison signal from the phase detector circuit 250. The charge pump circuit 254 may be configured to integrate the comparison to generate a control voltage. The charge pump circuit 254 may provide the control voltage to the delay circuit 262.

The initialization circuit 270 may be coupled to the charge pump circuit 254. The initialization circuit 270 may be configured to enable and disable the charge pump circuit 254 based on a level of the control voltage generated by the charge pump circuit 254. For example, the initialization circuit 270 may be configured to disable the charge pump circuit 254 in response to the control voltage being less than a first threshold or more than a second threshold. After disabling the charge pump circuit 254, the initialization circuit 270 may adjust the control voltage to bring the control voltage to be greater than the first threshold and less than the second threshold. In some embodiments, the initialization circuit 270 may adjust the control voltage to bring the control voltage to be approximately 50 percent of the supply voltage.

After adjusting the control voltage, the initialization circuit 270 may enable the charge pump circuit 254. When the charge pump circuit 254 is enabled, the charge pump circuit 254 may adjust the control voltage based on the comparison signal from the phase detector circuit 250. When the charge pump circuit 254 is disabled, the control voltage may be determined by the initialization circuit 270 and may not be based on the comparison signal from the phase detector circuit 250.

The first and second thresholds may be based on a supply voltage of the charge pump circuit 254. For example, the first threshold may be a value that is between 0 and 40 percent of the supply voltage. As another example, the first threshold may be between 0 and 30 percent or 0 and 15 percent of the supply voltage. The second threshold may be a value that is between 60 and 100 percent of the supply voltage. As another example, the second threshold may be a value that is between 70 and 100 percent or 85 and 100 percent of the supply voltage.

The values for the first and second thresholds may be based on a size of a delay range of the delay circuit 262. For example, when the delay circuit 262 has a large delay range such that the range of different delays that may be applied to a signal is large, the range of the control voltage may be large. The range of the control voltage being large may result in the first and second thresholds being closer to 0 percent and 100 percent, respectively, of the supply voltage. When the delay circuit 262 has a small delay range such that the range of different delays that may be applied to a signal is small, the range of the control voltage may be small. The range of the control voltage being small may result in the first and second thresholds being closer to 50 percent, respectively, of the supply voltage. For example, when the delay circuit 262 may delay a signal by a delay that ranges between 1 nanosecond and 100 nanoseconds, the first and second thresholds may be respective 10 and 90 percent of the supply voltage. In contrast, when the delay circuit 262 may delay a signal by a delay that ranges between 20 and 50 nanoseconds, the first and second thresholds may be respective 25 and 75 percent of the supply voltage.

The delay circuit 262 may be coupled to the divider circuit 240, the charge pump circuit 254, the first multiplexer circuit 210, and the third multiplexer circuit 280. The delay circuit 262 may be configured to receive the divided first clock signal from the divider circuit 240 and the control voltage from the charge pump circuit 254. The delay circuit 262 may delay the divided first clock signal by a delay that is determined based on the control voltage. For example, when the control voltage increases, the delay may increase. When the control voltage decreases, the delay may decrease and when the control voltage maintains the same, the delay may maintain the same. The delay circuit 262 may output the delayed divided first clock signal as the second clock signal. The delay circuit 262 may provide the second clock signal to the third multiplexer circuit 280 and the first multiplexer circuit 210.

As discussed above, the range of delays of the delay circuit 262 may affect the range of the control voltage of the circuit 200. In some embodiments, reducing the range of different delays that may be applied to a signal by the delay circuit 262 may reduce the complexity and power consumption of the delay circuit 262. Furthermore, reducing the range may reduce jitter and/or other noise on the second clock signal caused by the delay circuit 262. Reducing the jitter and/or other noise on the second clock signal may increase a timing window for the second multiplexer circuit 220 to sample the first and second combined data signals.

The third multiplexer circuit 280 may be coupled to the delay circuit 262 and to the phase detector circuit 250. The third multiplexer circuit 280 may be configured to receive the second clock signal. The third multiplexer circuit 280 may be a replica of the first multiplexer circuit 210. As a result, in these and other embodiments, the third multiplexer circuit 280 may have similar or the same functionality, design, circuit layout, and manufacturing process as the first multiplexer circuit 210. Thus, the third multiplexer circuit 280 may respond in a similar or the same manner to variations in process, temperature, supply voltage, and other variations as the first multiplexer circuit 210.

The third multiplexer circuit 280 may include first, second, third, and fourth input terminals 282a, 282b, 282c, and 282d, referred to herein as "the input terminals 282." The second and fourth input terminals 282b and 282d may be coupled to a first supply voltage ("VCC") that has a voltage that is at or above a logical high for data in the circuit 200. The first and third input terminals 282a and 282c may be coupled to a second supply voltage ("VSS") that has a voltage that is at or below a logical low for data in the adjust circuit 230. In some embodiments, the second supply voltage may be ground. Thus, the first and third input terminals 282a and 282c may both have a logical low data signal and the second and fourth input terminals 282b and 282d may both have a logical high data signal.

The third multiplexer circuit 280 may be configured to multiplex the logical low data signal from the first input terminal 282a with the logical high data signal from the second input terminal 282b based on the second clock signal to generate the output signal. In these and other embodiments, the signal generated by multiplexing the signals on the third and fourth input terminals 282c and 282d may not be used. Alternately or additionally, the third multiplexer circuit 280 may be configured to multiplex the logical low data signal from the third input terminal 282c with the logical high data signal from the fourth input terminal 282d based on the second clock signal to generate the output signal. In these and other embodiments, the signal generated by multiplexing the signals on the first and second input terminals 282a and 282b may not be used.

Alternately or additionally, the output signal may be a differential signal. In these and other embodiments, a first signal of the differential output signal may be generated by multiplexing the logical low data signal from the first input terminal 282a with the logical low high data signal from the second input terminal 282b. The second signal of the differential output signal may be generated by multiplexing logical low data signal from the third input terminal 282c with the logical high data signal from the fourth input terminal 282d. In these and other embodiments, the first clock signal and the second clock signal may also be differential signals.

The output signal generated by the third multiplexer circuit 280 may have a similar or the same phase and frequency as the first and second combined data signals output by the first multiplexer circuit 210. Because the output signal is generated by multiplexing logical high and low signals, the output signal alternates between a logical high and logical low as a clock signal. The output signal may be provided to the phase detector circuit 250.

The third multiplexer circuit 280, the phase detector circuit 250, the charge pump circuit 254, and the delay circuit 262 may form a delay-locked-loop that may act to bring the phase of the output signal to match the phase of the inverted first clock signal. When the phase of the output signal matches the phase of the inverted first clock signal, the output signal may be locked to the inverted first clock signal and the delay-locked-loop may be locked.

Figure 3:
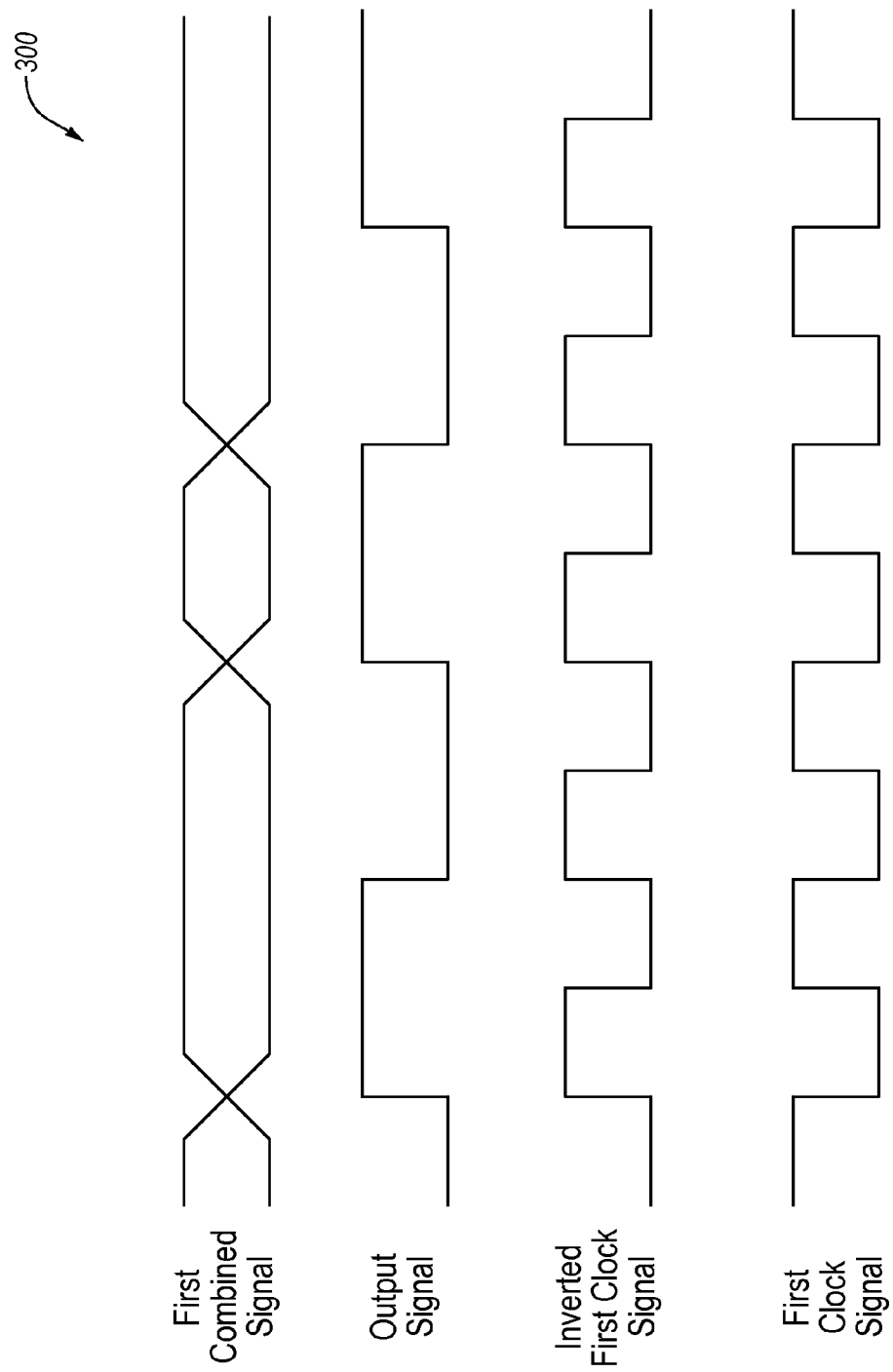
FIG. 3 illustrates a timing diagram of various signals.

FIG. 3 illustrates a timing diagram 300 of various signals in the circuit 200 when the output signal is locked to the inverted first clock signal. In particular, the timing diagram 300 illustrates the first combined data signal, the output signal, the inverted first clock signal, and the first clock signal when the delay-locked-loop is locked. As illustrated, the output signal and the inverted first clock signal are locked and the output signal has a clock rate that is one-half the clock rate of the inverted first clock signal and the first clock signal.

A discussion of the circuit 200 with respect to the timing diagram 300 of FIG. 3 follows. In the timing diagram 300 of FIG. 3, the comparison signal output by the phase detector circuit 250 of FIG. 2 may be a logical high at the rising edge of the output signal because it is in phase with the rising edge of the inverted first clock signal. The comparison signal may be a logical low at the falling edge of the output signal because the inverted first clock signal may be rising when the output signal is falling. Due to the alternating nature of the output signal and the inverted first clock signal, the comparison signal may have an equal number of logical highs and lows. As a result, when the comparison signal is integrated by the charge pump circuit, the resulting control voltage may be mostly steady. As a result, the delay of the delay circuit 262 may be maintained and thus the phase of the second clock signal may remain the same. As a result, the phase of the output signal may remain the same.

As illustrated in FIG. 3, when the phase of the output signal is locked to the phase of the inverted first clock signal, a rising edge of the first clock signal may occur in approximately the center of a period between edges of the output signal. As a result, a middle of a symbol of the first combined data signal may align with an edge of the first clock signal.

When the phase of the output signal is not locked to the phase of the inverted first clock signal, the comparison signal output by the phase detector circuit 250 may include more logical highs or more logical lows. As a result, the comparison signal when integrated by the charge pump circuit 254 may result in a change to the control voltage. A change in the control voltage may adjust the delay applied to the divided first clock signal by the delay circuit 262. Therefore, the phase of the second clock signal may change. A change in the phase of the second clock signal may adjust when the third multiplexer circuit 280 outputs the output signal, thereby adjusting the phase of the output signal. The adjust circuit 230 may operate as discussed above until the phase of the output signal locks to the phase of the inverted first signal.

Modifications, additions, or omissions may be made to the circuit 200 without departing from the scope of the present disclosure. For example, in some embodiments, the circuit 200 may include additional passive or active circuit components.

Figure 4:
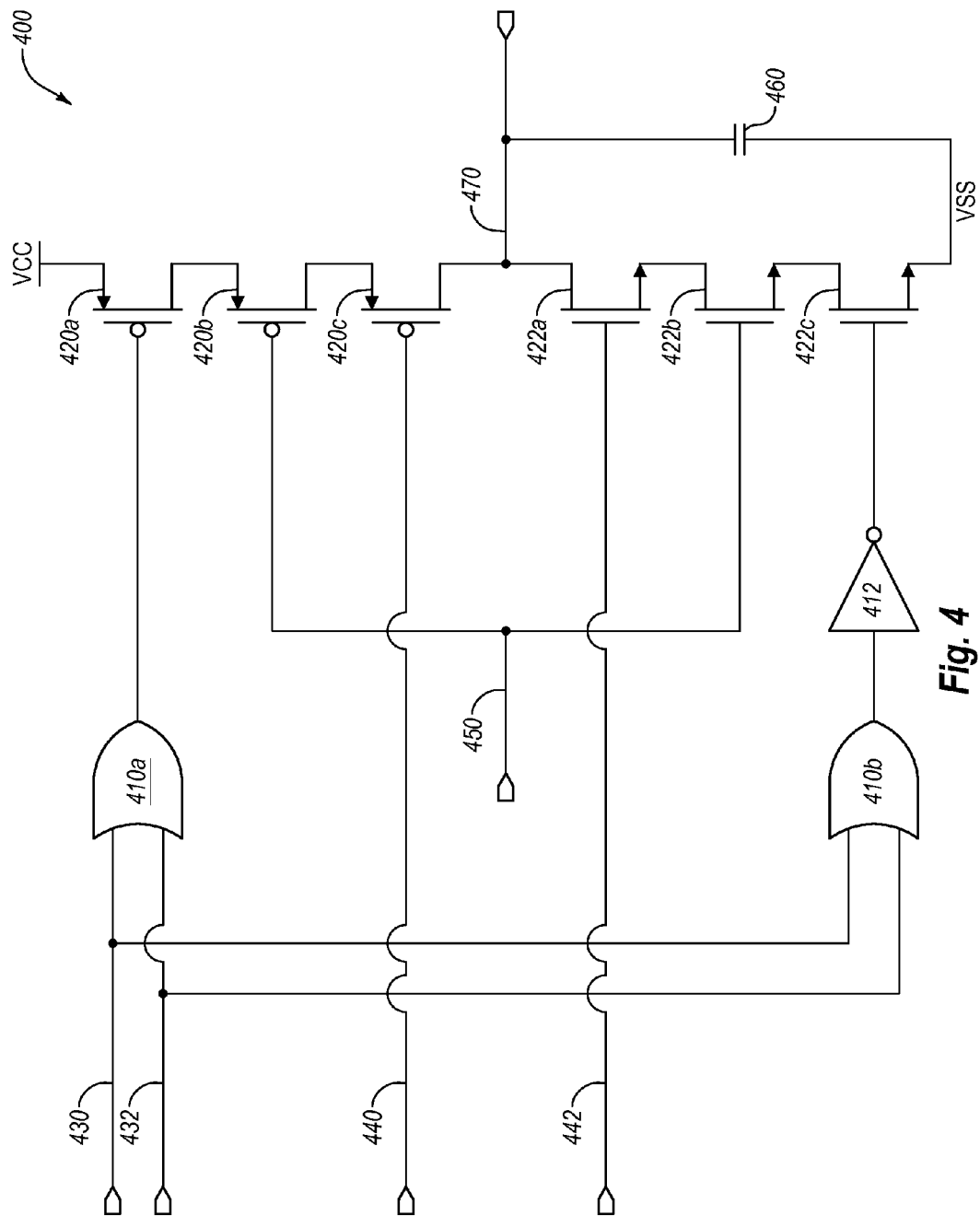
FIG. 4 is a diagram of an example charge pump circuit.

FIG. 4 is a diagram of an example charge pump circuit 400 ("the circuit 400"), arranged in accordance with at least one embodiment described herein. The circuit may be an example implementation of the charge pump circuit 254 of FIG. 2.

The circuit 400 may include first and second OR gate circuits 410a and 410b, referred to herein as the "OR gate circuits 410;" an inverter circuit 412; first, second, and third p-type transistors 420a, 420b, and 420c, referred to herein as the "p-type transistors 420;" first, second, and third n-type transistors 422a, 422b, and 422c, referred to herein as the "n-type transistors 422;" a capacitance 460; first, second, third, fourth, and fifth input terminals 430, 432, 440, 442, and 450; and an output terminal 470.

Each of the n-type transistors 422 and the p-type transistors 420 may include a gate terminal, a source terminal, and a drain terminal. As illustrated in FIG. 4, the source terminal may be the terminal with the arrow, the gate terminal may be the terminal with the parallel horizontal lines, and the drain terminal may be the other terminal.

The p-type transistors 420 may be coupled between VCC and the output terminal 470. When all of the gates of the p-type transistors 420 are held at a logical low or below a voltage for the p-type transistors 420 to conduct, the p-type transistors 420 may couple the output terminal 470 to VCC. When one or more of the gates of the p-type transistors 420 are held at a logical high, the one or more of the p-type transistors 420 may not conduct and may present a high impedance state to the output terminal 470.

The n-type transistors 422 may be coupled between VSS and the output terminal 470. When all of the gates of the n-type transistors 422 are held at a logical high or above a voltage for the n-type transistors 422 to conduct, the n-type transistors 422 may couple the output terminal 470 to VSS. When one or more of the gates of the n-type transistors 422 are held at a logical low, the one or more of the n-type transistors 422 may not conduct and may present a high impedance state to the output terminal 470.

The OR gate circuits 410 may be coupled to the first and second input terminals 430 and 432. The OR gate circuits 410 may be further configured to receive first and second control signals over the first and second input terminals 430 and 432. The first and second control signals may be provided from the initialization circuit 270, such as the initialization circuit 270 or 500 of FIGS. 2 and 5. The first and second control signals may be either a logical high or a logical low. The OR gate circuits 410 may be configured to output a logical low when both of the first and second control signals are a logical low. When either or both of the first and second control signals are a logical high, the OR gate circuits 410 may output a logical high.

The output of the first OR gate circuit 410a may be coupled to the gate of the first p-type transistor 420a. The logical high output by the first OR gate circuit 410a may cause the first p-type transistor 420a to not conduct. Thus, the p-type transistors 420 may present a high impedance state to the output terminal 470.

The output of the second OR gate circuit 410b may be coupled to an input of the inverter circuit 412. The output of the inverter circuit 412 may be coupled to the gate of the third n-type transistor 422c. The logical high output by the second OR gate circuit 410b may be inverted by the inverter circuit 412 to become a logical low and may cause the third n-type transistor 422c to not conduct. Thus, the n-type transistors 422 may present a high impedance state to the output terminal 470.

The third and fourth input terminals 440 and 442 may be coupled to respective first and second reference voltages. In some embodiments, the circuit 400 may provide one or more circuits to generate the reference voltages. The reference voltages may be generated when power is supplied to the circuit 400. The first reference voltage may cause the third p-type transistor 420c to conduct. The second reference voltage may cause the first n-type transistor 422a to conduct.

The fifth input terminal 450 may be coupled to the gates of the second p-type transistor 420b and the second n-type transistor 422b. The fifth input terminal 450 may be configured to receive a comparison signal from a phase detector circuit, such as the phase detector circuit 250 of FIG. 2. The comparison signal may be a logical high or a logical low. When the comparison signal is a logical low, the second p-type transistor 420b may conduct and the second n-type transistor 422b may not conduct. When the comparison signal is a logical low, the second p-type transistor 420b may not conduct and the second n-type transistor 422b may conduct.

When the first and second reference voltages are being supplied and the first and second control signals are logical lows, the circuit 400 may be enabled and may generate a control voltage on the output terminal 470 based on the comparison signal. In these and other embodiments, when the comparison signal is low, current may be supplied to the output terminal 470 through the p-type transistors 420 and stored on the capacitance 460 to thereby generate the control voltage that is output on the output terminal 470. When the comparison signal is high, current may be pulled from the capacitance 460 through the n-type transistors 422 to thereby lower the control voltage.

When either or both of the control signals are a logical high and/or the reference voltages are changed, the circuit 400 may be disabled. As a result, changes in the comparison signal may not result in changes to the control voltage. In some embodiments, other circuits may be used to adjust the control voltage. For example, an initialization circuit, such as the initialization circuits 270 and 500 of FIGS. 2 and 5, may be used to adjust the control voltage.

Modifications, additions, or omissions may be made to the circuit 400 without departing from the scope of the present disclosure. For example, in some embodiments, the circuit 400 may include additional passive or active circuit components. As another example, the circuit 400 may include circuits for generating the reference voltages.

Figure 5:
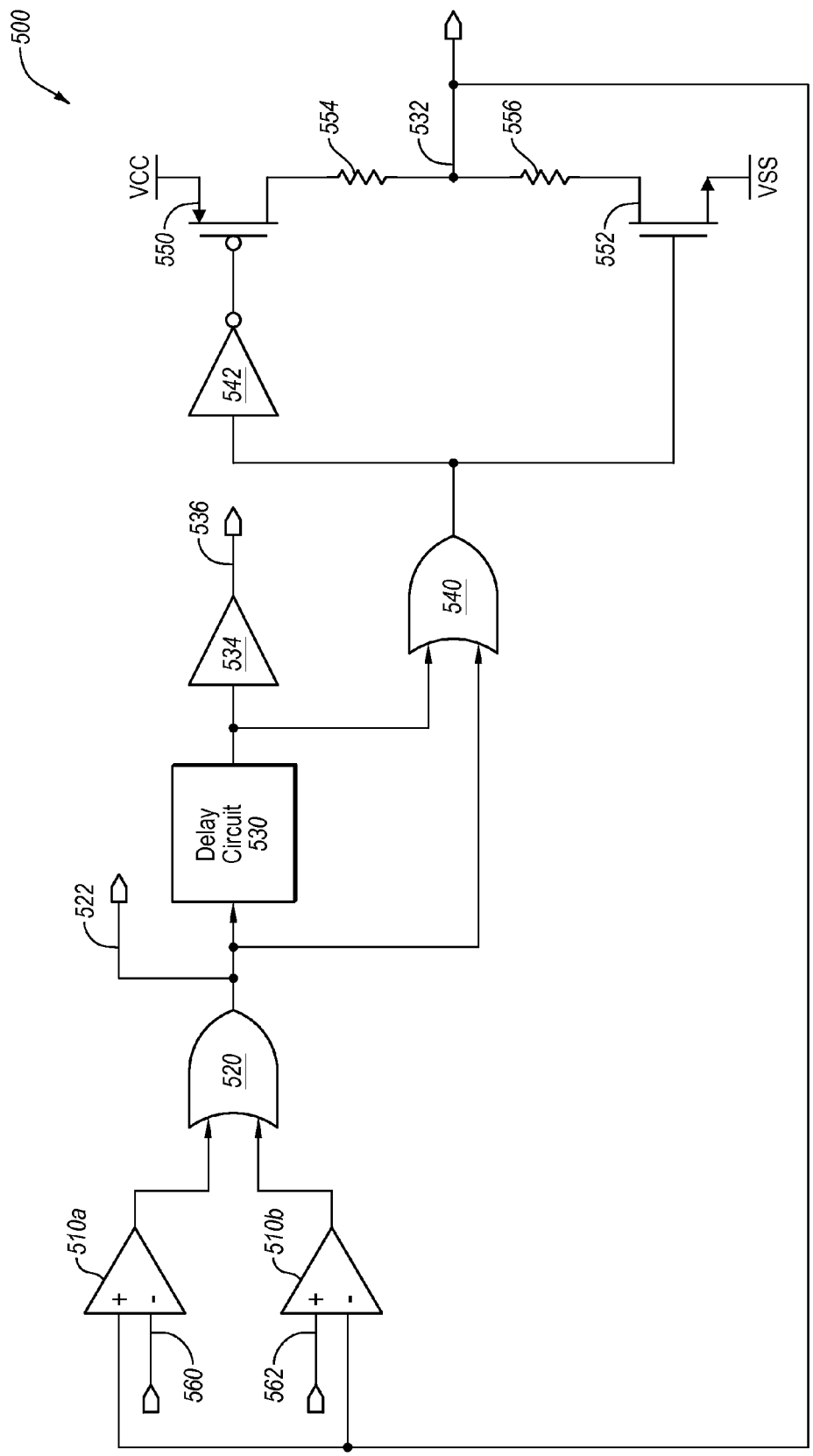
FIG. 5 is a diagram of an example initialization circuit.

FIG. 5 is a diagram of an example initialization circuit 500 ("the circuit 500"), arranged in accordance with at least one embodiment described herein. The circuit 500 may be an example implementation of the initialization circuit 270 of FIG. 2. The circuit 500 may include first and second comparator circuits 510a and 510b, first and second OR gate circuits 520 and 540, a delay circuit 530, a buffer circuit 534, an inverter circuit 542, first and second transistors 550 and 552, and first and second resistances 554 and 556.

Each of the first and second transistors 550 and 552 may include a gate terminal, a source terminal, and a drain terminal. As illustrated in FIG. 5, the source terminal may be the terminal with the arrow, the gate terminal may be the terminal with the parallel horizontal lines, and the drain terminal may be the other terminal.

The first comparator circuit 510a may have positive and negative input terminals. The positive input terminal may be coupled to a first output terminal 532 that is coupled to an output of charge pump circuit that supplies a control voltage, such as the charge pump circuit 254 or 400 of FIGS. 2 and 4. As a result, the positive input terminal may receive the control voltage. The negative input terminal may be coupled to a first input terminal 560 that is configured to receive a first reference voltage. The value of the first reference voltage may be determined in a similar manner as the value of the first threshold as described with respect to FIG. 2.

When the control voltage is greater than the first reference voltage, the first comparator circuit 510a may output a logical high. When the control voltage is less than the first reference voltage, the first comparator circuit 510a may output a logical low. The output of the first comparator circuit 510a may be provided to the first OR gate circuit 520.

The second comparator circuit 510b may have positive and negative input terminals. The positive input terminal may be coupled to a second input terminal 562 that is configured to receive a second reference voltage. The value of the second reference voltage may be determined in a similar manner as the value of the second threshold as described with respect to FIG. 2. The negative input terminal may be coupled to the first output terminal 532. As a result, the negative input terminal may receive the control voltage.

When the control voltage is greater than the second reference voltage, the second comparator circuit 510b may output a logical low. When the control voltage is less than the second reference voltage, the second comparator circuit 510b may output a logical high. The output of the second comparator circuit 510b may be provided to the first OR gate circuit 520.

The first OR gate circuit 520 may receive the outputs of the first and second comparator circuits 510a and 510b and generate a first control signal based on the outputs of the first and second comparator circuits 510a and 510b. The first control signal may be a logical high when either of the outputs of the first and second comparator circuits 510a and 510b is a logical high. The first OR gate circuit 520 may provide the first control signal to the delay circuit 530, the second OR gate circuit 540, and a second output terminal 522.

The second output terminal 522 may be configured to provide the first control signal to a charge pump circuit, such as the charge pump circuit 254 or 400 of FIGS. 2 and 4. When the first control signal is a logical high, the first control signal may disable the charge pump circuit.

The delay circuit 530 may be configured to delay the first control signal and to output the delayed first control signal. The amount of delay of the delay circuit 530 may be based on the values of the first and second reference voltages and a particular voltage for the control voltage. In particular, the amount of delay of the delay circuit 530 may be based on a voltage difference between the values of the first and second reference voltages and the particular voltage for the control voltage and how long it may take the circuit 500 to adjust the control voltage an amount of the voltage difference. The delay circuit 530 may provide the delayed first control signal to the second OR gate circuit 540 and the buffer circuit 534.

The buffer circuit 534 may receive the delayed control signal and output a second control signal. The second control signal may be output on a third output terminal 536. The third output terminal 536 may be configured to provide the second control signal to a charge pump circuit, such as the charge pump circuit 254 or 400 of FIGS. 2 and 4. When the second control signal is a logical high, the second control signal may disable the charge pump circuit.

The second OR gate circuit 540 may receive the first control signal and the delayed first control signal and generate a third control signal based on the first control signal and the delayed first control signal. The third control signal may be a logical high when either of the first control signal and the delayed first control signal is a logical high.

The first OR gate circuit 520 may provide the third control signal to the gate of the second transistor 552 and to the inverter circuit 542. When the third control signal is a logical high, the third control signal may cause the second transistor 552 to conduct. The source of the second transistor 552 may be coupled to VSS. The drain of the second transistor may be coupled to the second resistance 556. The second resistance 556 may also be coupled to the first output terminal 532.

The inverter circuit 542 may invert the third control signal and provide the third control signal to the gate of the first transistor 550. When the inverted third control signal is a logical high, the inverted third control signal may cause the first transistor 550 to conduct. The source of the first transistor 550 may be coupled to VCC. The drain of the first transistor 550 may be coupled to the first resistance 554. The first resistance 554 may be coupled to the first output terminal 532.

An example explanation of the circuit 500 follows. Assume that the first voltage reference is 75 percent of VCC and that the second voltage reference is 25 percent of VCC. Furthermore assume that the control voltage output by a charge pump circuit, such as the charge pump circuit 254 or 400 of FIGS. 2 and 4 and which is coupled to the circuit 500 is 20 percent of VCC. The second comparator circuit 510b may compare the control voltage to the second reference voltage and determine that the control voltage is less than the second reference voltage. The second comparator circuit 510b may output a logical high to the first OR gate circuit 520. In response to receiving the logical high, the first OR gate circuit 520 may output the first control signal with a logical high. The first control signal may be passed to the charge pump circuit and disable the charge pump circuit such that the charge pump circuit no longer provides or removes charge to change the control voltage.

The first control signal may be provided to the delay circuit 530 and the second OR gate circuit 540. The delay circuit 530 may continue to output a logical low for a period such that the second control signal is a logical low. The second OR gate circuit 540 may output a logical high that may cause the first and second transistors 550 and 552 to conduct. In response to the first and second transistors 550 and 552 conducting, a current may flow through the first and second resistances 554 and 556 such that a voltage develops on the first output terminal 532. The voltage on the first output terminal may begin to raise the level of the control voltage. After the control voltage reaches 25 percent of VCC, the second comparator circuit 510b may output a logical low and the first comparator circuit 510a may output a logical low. As a result, the first OR gate circuit 520 may output the first control signal with a logical low. At this point, however, the second control signal output by the delay circuit 530 may be the logical high as previously output by the first OR gate circuit 520. The second control signal at the logical high may result in the charge pump circuit remaining disabled. Furthermore, the second control signal at the logical high may result in the first and second transistors 550 and 552 continuing to conduct. Thus, the control voltage may continue to be raised past the second reference voltage toward a voltage based on the values of the first and second resistances 554 and 556. In this example, the delay of the delay circuit 530 may be sufficient to allow the voltage developed by the first and second resistances to raise the control voltage past the second reference voltage to a particular voltage or the voltage developed by the first and second resistances 554 and 556. In some embodiments, the particular voltage and/or the voltage based on the values of the first and second resistances 554 and 556 may be 50 percent of VCC. In these and other embodiments, the values of the first and second resistances 554 and 556 may be the same.

Modifications, additions, or omissions may be made to the circuit 500 without departing from the scope of the present disclosure. For example, in some embodiments, the circuit 500 may include additional passive or active circuit components.

In FIGS. 4 and 5, the illustrated transistors are illustrated as metal-oxide-semiconductor field-effect transistor (MOSFET) transistors. The above description uses the nomenclature gate, source, and drain to represent different terminals of the transistors. The use of the names gate, source, and drain may be used to describe generically the terminals of a MOSFET transistor, or other types of transistors, such as bipolar junction transistors (BJT), junction gate field-effect transistors (JFET), and insulated gate bipolar transistors. Furthermore, in some embodiments, some combination of n-type and p-type transistors may be used other than that illustrated.

Figure 6:
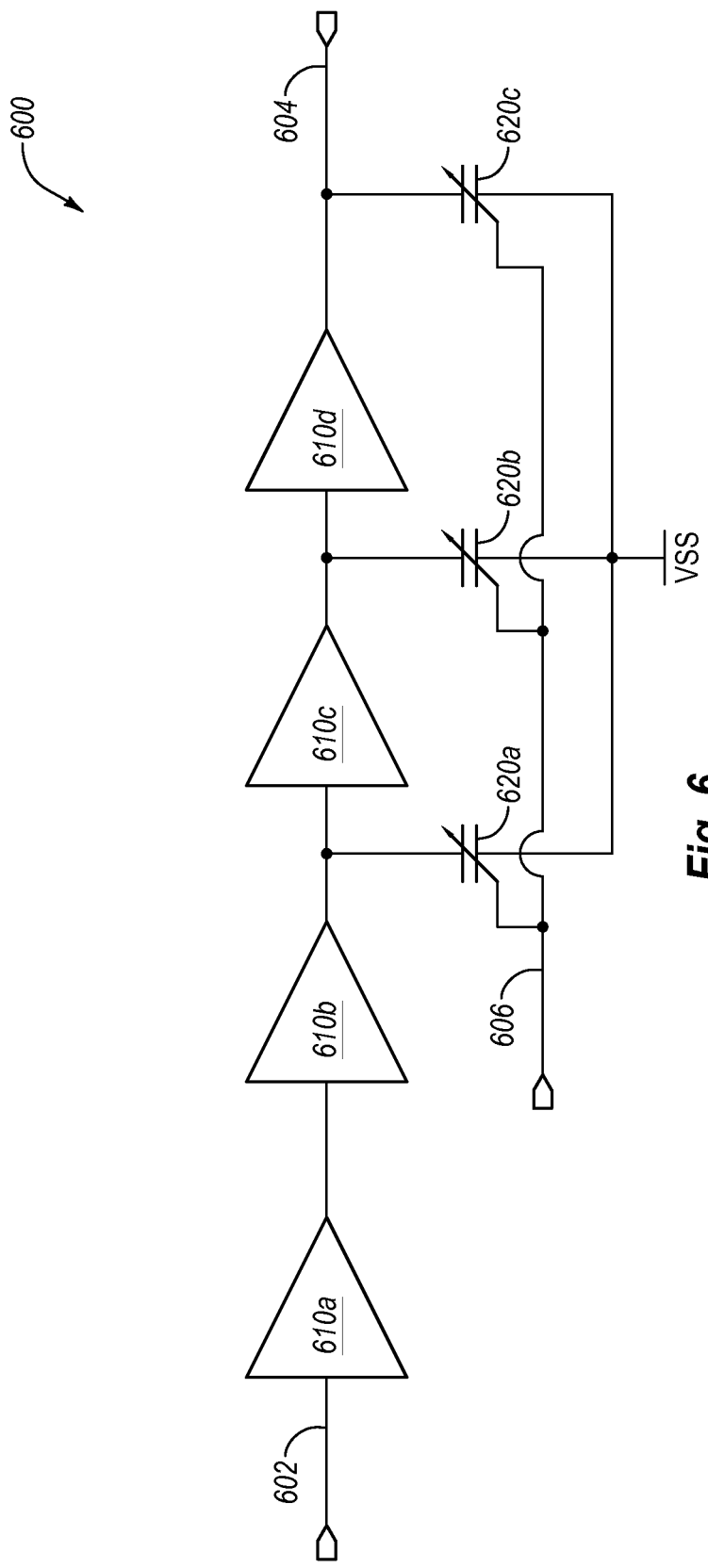
FIG. 6 is a diagram of an example delay circuit.

FIG. 6 is a diagram of an example delay circuit ("the circuit 600"), arranged in accordance with at least one embodiment described herein. The circuit 600 may include a first input terminal 602; a second input terminal 606; an output terminal 604; first, second, third, and fourth buffer circuits 610a, 610b, 610c, and 610d, referred to herein as "the buffer circuits 610;" and first, second, and third adjustable capacitance circuits 620a, 620b, and 620c, referred to herein as "the adjustable capacitance circuits 620." Each of the buffer circuits 610 may include an input terminal and an output terminal.

The first input terminal 602 may be coupled to the input terminal of the first buffer circuit 610a. The output terminal of the first buffer circuit 610a may be coupled to the input terminal of the second buffer circuit 610b. The output terminal of the second buffer circuit 610b may be coupled to the input terminal of the third buffer circuit 610c. The output terminal of the third buffer circuit 610c may be coupled to the input terminal of the fourth buffer circuit 610d. The output terminal of the fourth buffer circuit 610d may be coupled to the output terminal 604. The first adjustable capacitance circuit 620a may be coupled between VSS and the output and input terminals of the respective second and third buffer circuits 610b and 610c. The second adjustable capacitance circuit 620b may be coupled between VSS and the output and input terminals of the respective third and fourth buffer circuits 610c and 610d. The third adjustable capacitance circuit 620c may be coupled between the output terminal 604 and VSS.

Each of the adjustable capacitance circuits 620 may be coupled to the second input terminal 606. The second input terminal 606 may be configured to receive a control voltage, such as the control voltage generated by the charge pump circuit 254 or 400 of FIGS. 2 and 4. The control voltage may adjust the adjustable capacitances of the adjustable capacitance circuits 620. An amount of capacitance seen by each of the buffer circuits 610 may adjust a delay through each of the buffer circuits 610. Adjusting the capacitances of the adjustable capacitance circuits 620 may adjust the capacitance seen by the buffer circuits 610 thereby adjusting the delay of the circuit 600. Adjusting the delay of the circuit 600 may adjust the delay of a signal that passes through the circuit 600 from the first input terminal 602 to the output terminal 604 through the buffer circuits 610.

Modifications, additions, or omissions may be made to the circuit 600 without departing from the scope of the present disclosure. For example, in some embodiments, the circuit 600 may include additional passive or active circuit components. As another example, the circuit 600 may include more or fewer buffer circuits 610, more or fewer adjustable capacitance circuits 620, or some combination thereof. In these and other embodiments, a number of buffer circuits 610 and a number of adjustable capacitance circuits 620 may be selected based on a range of the delays that may be used by a circuit in which the circuit 600 is implemented.

Figure 7:
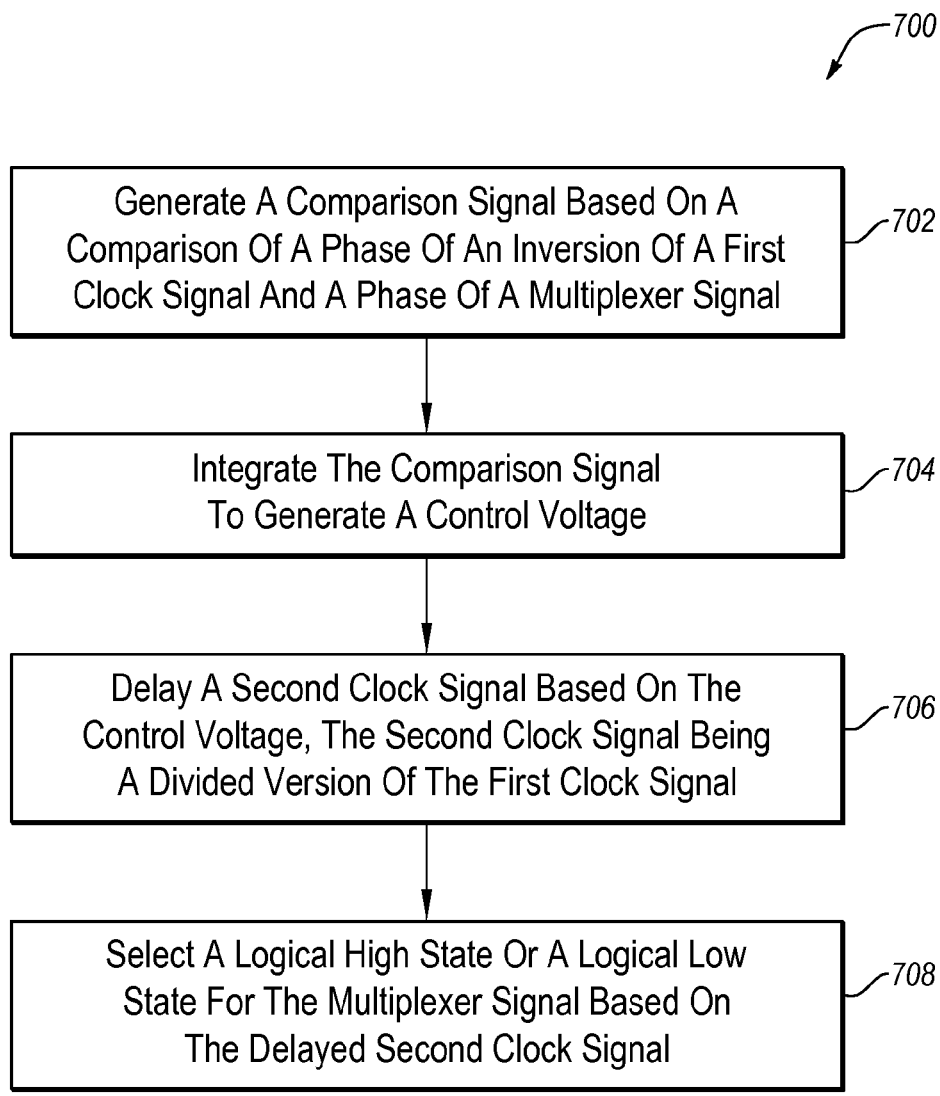
FIG. 7 is a flowchart of an example method of adjusting signal phase in a serializer circuit.

FIG. 7 is a flowchart of an example method 700 of adjusting signal phase in a serializer circuit, arranged in accordance with at least one embodiment described herein. The method 700 may be implemented, in some embodiments, by a circuit, such as the circuit 100 or 200 of FIGS. 1 and 2. Although illustrated as discrete blocks, various blocks may be divided into additional blocks, combined into fewer blocks, or eliminated, depending on the desired implementation.

The method 700 may begin at block 702, where a comparison signal may be generated based on a comparison of a phase of an inversion of a first clock signal and a phase of a multiplexer signal. In block 704, the comparison signal may be integrated to generate a control voltage.

In block 706, a second clock signal may be delayed based on the control voltage. The second clock signal may be a divided version of the first clock signal. In some embodiments, delaying the second clock signal based on the control voltage may include adjusting a variable capacitance using the control voltage to adjust a delay applied to the second clock signal.

In block 708, a logical high state or a logical low state may be selected for the multiplexer signal based on the delayed second clock signal.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

For example, in some embodiments, the method 700 may further include dividing the first clock signal to generate the second clock signal. In some embodiments, the first clock signal may be divided by two.

In some embodiments, the method 700 may further include comparing the control voltage to first and second threshold voltages. In some embodiments, the control voltage may be generated based on the comparison signal in response to the control voltage being greater than the first threshold voltage and less than the second threshold voltage. In these and other embodiments, the method 700 may further include setting the control voltage to approximately one-half of a supply voltage in response to the control voltage being less than the first threshold voltage or more than the second threshold voltage.

In some embodiments, the method 700 may further include providing the delayed second clock signal to a first multiplexer circuit in a serializer circuit. In these and other embodiments, selecting the logical high state or the logical low state for the multiplexer signal may be performed by a second multiplexer circuit that is a replica of the first multiplexer circuit.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

All examples and conditional language recited herein are intended as pedagogical objects to aid the reader in understanding the invention and the concepts contributed by the inventor to furthering the art, and are to be construed as being without limitation to such specifically recited examples and conditions. Although embodiments of the present inventions have been described in detail, it should be understood that the various changes, substitutions, and alterations could be made hereto without departing from the spirit and scope of the invention.

What is claimed is:

1. A circuit, comprising:
   a phase detector circuit, the phase detector circuit configured to output a comparison signal based on a comparison of a phase of an inversion of a first clock signal and a phase of a multiplexer signal;
   a charge pump circuit coupled to the phase detector circuit, the charge pump circuit configured to integrate the comparison signal and to output a control voltage based on the integration of the comparison signal;
   a delay circuit coupled to the charge pump circuit, the delay circuit configured to receive a second clock signal, to delay the second clock signal based on the control voltage, and to output the delayed second clock signal, the second clock signal is a divided version of the first clock signal; and
   a multiplexer circuit coupled to the delay circuit and the phase detector circuit, the multiplexer circuit configured to output the multiplexer signal based on the delayed second clock signal.

2. The circuit of claim 1, further comprising a divider circuit coupled to the delay circuit, the divider circuit configured to divide the first clock signal to generate the second clock signal.

3. The circuit of claim 2, wherein the divider circuit divides the first clock signal by two.

4. The circuit of claim 1, further comprising an initialization circuit coupled to the charge pump circuit, the initialization circuit configured to enable and disable the charge pump circuit based on a level of the control voltage.

5. The circuit of claim 4, wherein the initialization circuit includes a comparison circuit configured to compare the control voltage to a first threshold voltage and a second threshold voltage, wherein the initialization circuit is configured to disable the charge pump circuit in response to the control voltage being less than the first threshold voltage or more than the second threshold voltage.

6. The circuit of claim 5, wherein the initialization circuit further includes a regulation circuit configured to bring the control voltage to approximately half of a supply voltage of the charge pump circuit in response to the charge pump circuit being disabled.

7. The circuit of claim 4, wherein the charge pump circuit includes at least two transistors controlled by the initialization circuit that are configured to enable or disable the charge pump circuit.

8. The circuit of claim 1, wherein the delay circuit includes one or more buffers and at least one adjustable capacitance coupled to an output of one of the one or more buffers, the at least one adjustable capacitance configured to be adjusted based on the control voltage to adjust a delay of the one or more buffers.

9. The circuit of claim 1, wherein the first clock signal is a differential first clock signal and the multiplexer signal is a differential multiplexer signal.

10. The circuit of claim 1, wherein the multiplexer circuit is a first multiplexer circuit, the circuit further comprising:
    a second multiplexer circuit configured to output first and second multiplexer signals based on the delayed second clock signal, wherein the second multiplexer circuit is a four-by-two multiplexer; and
    a third multiplexer circuit coupled to the second multiplexer circuit and configured to select the first or the second second multiplexer signals to output based on the first clock signal, wherein the third multiplexer circuit is a two-to-one multiplexer.

11. The circuit of claim 10, wherein the first multiplexer circuit is a replica of the second multiplexer circuit.

12. The circuit of claim 11, wherein first and second inputs to the first multiplexer circuit, which are selected based on the delayed second clock signal to generate the multiplexer signal, are a logical low voltage and logical high voltage.

13. A method, comprising:
    generating a comparison signal based on a comparison of a phase of an inversion of a first clock signal and a phase of a multiplexer signal;
    integrating the comparison signal to generate a control voltage;
    delaying a second clock signal based on the control voltage, the second clock signal being a divided version of the first clock signal; and
    selecting a logical high state or a logical low state for the multiplexer signal based on the delayed second clock signal.

14. The method of claim 13, further comprising dividing the first clock signal to generate the second clock signal.

15. The method of claim 14, wherein the first clock signal is divided by two.

16. The method of claim 13, further comprising comparing the control voltage to first and second threshold voltages, wherein the control voltage is generated based on the comparison signal in response to the control voltage being greater than the first threshold voltage or less than the second threshold voltage.

17. The method of claim 16, further comprising setting the control voltage to approximately one-half of a supply voltage in response to the control voltage being less than the first threshold voltage or more than the second threshold voltage.

18. The method of claim 13, wherein delaying the second clock signal based on the control voltage includes adjusting a variable capacitance using the control voltage to adjust a delay applied to the second clock signal.

19. The method of claim 13, further comprising providing the delayed second clock signal to a first multiplexer circuit in a serializer circuit.

20. The method of claim 19, wherein selecting the logical high state or the logical low state for the multiplexer signal is performed by a second multiplexer circuit that is a replica of the first multiplexer circuit.

* * * * *